United States Patent
Kuroda et al.

(10) Patent No.: US 9,147,831 B2
(45) Date of Patent: Sep. 29, 2015

(54) CRYSTAL UNIT AND METHOD FOR FABRICATING THE SAME

(71) Applicant: NIHON DEMPA KOGYO CO., LTD., Tokyo (JP)

(72) Inventors: Tomotaka Kuroda, Saitama (JP); Makoto Hatano, Saitama (JP); Shigeharu Monoe, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 466 days.

(21) Appl. No.: 13/629,619

(22) Filed: Sep. 28, 2012

(65) Prior Publication Data

US 2013/0082573 A1   Apr. 4, 2013

(30) Foreign Application Priority Data

Oct. 3, 2011   (JP) ................................. 2011-219204

(51) Int. Cl.
| | | |
|---|---|---|
| H01L 41/22 | (2013.01) | |
| C23F 1/00 | (2006.01) | |
| H01L 41/332 | (2013.01) | |
| H03H 9/05 | (2006.01) | |
| H03H 9/10 | (2006.01) | |
| H01L 41/053 | (2006.01) | |

(52) U.S. Cl.
CPC ........... *H01L 41/332* (2013.01); *H03H 9/0504* (2013.01); *H03H 9/0595* (2013.01); *H03H 9/1014* (2013.01); *H03H 9/1035* (2013.01); *H01L 41/053* (2013.01); *Y10T 29/42* (2015.01)

(58) Field of Classification Search
USPC ................ 310/340, 344, 348, 360; 216/2
See application file for complete search history.

(56) References Cited

U.S. PATENT DOCUMENTS

| | | | |
|---|---|---|---|
| 2009/0179524 A1* | 7/2009 | Saito ............................. | 310/348 |
| 2010/0156246 A1* | 6/2010 | Iwai .............................. | 310/344 |
| 2011/0187235 A1* | 8/2011 | Yoshimatsu .................. | 310/348 |
| 2014/0176646 A1* | 6/2014 | Hirai et al. ..................... | 347/71 |
| 2014/0203688 A1* | 7/2014 | Kozuki ......................... | 310/344 |

FOREIGN PATENT DOCUMENTS

| | | |
|---|---|---|
| JP | 08-242134 | 9/1996 |
| JP | 2007-214941 | 8/2007 |
| JP | 2007-243681 | 9/2007 |
| JP | 2008-182665 | 8/2008 |
| JP | 2010-056833 | 3/2010 |
| JP | 2010-177540 | 8/2010 |
| JP | 2011-087075 | 4/2011 |
| JP | 2011-151857 | 8/2011 |

OTHER PUBLICATIONS

"Office Action of Japan Counterpart Application", issued on Jun. 2, 2015, P1-P4, in which five of the listed references (JP2007-214941, JP2007-243681, JP2008-182665, JP2011-087075 and JP2011-151857) were cited.

* cited by examiner

*Primary Examiner* — Thomas Dougherty
(74) *Attorney, Agent, or Firm* — Jianq Chyun IP Office

(57) ABSTRACT

A method for fabricating a crystal unit, including a preparing step, a bonding step, and a separating step, is provided. The preparing step prepares a quartz plate and a supporting substrate with a recess that is larger than the vibrating region on a surface of the supporting substrate. The recess corresponds to a vibrating region in the crystal unit. The bonding step bonds the quartz plate to the surface of the supporting substrate such that the quartz plate is separated from the supporting substrate in the recess. The separating step separates the quartz plate into the vibrating region and the framing portion by performing dry etching on the quartz plate such that the quartz plate has a shape that connects the vibrating region to the framing portion via a supporting beam. The framing portion surrounds the vibrating region.

16 Claims, 9 Drawing Sheets

CRYSTAL UNIT AND METHOD FOR FABRICATING THE SAME

CROSS-REFERENCE TO RELATED APPLICATIONS

This application claims the priority benefit of Japan application serial no. 2011-219204, filed on Oct. 3, 2011. The entirety of the above-mentioned patent application is hereby incorporated by reference herein and made a part of this specification.

TECHNICAL FIELD

This disclosure relates to a crystal unit and a method for fabricating the crystal unit. More particularly, this disclosure relates to a crystal unit appropriate for downsizing and a method for fabricating this crystal unit.

DESCRIPTION OF THE RELATED ART

A crystal unit is widely used in various electronic devices as a frequency reference source or a time reference source. The crystal unit generally includes a plurality of excitation electrodes on a surface of a quartz plate (in other words, a crystal sheet), which functions as a vibrating plate. The crystal unit further hermetically encloses the quartz plate inside a container, and includes an excitation electrode that is electrically extracted to the outside of the container. The crystal unit has a resonant frequency, which is defined by a shape, a size, and a crystal orientation of the quartz plate. Obtaining a desired resonant frequency of the crystal unit needs a precise contour routing of the quartz plate.

There has been a growing need for a downsized crystal unit as an electronic device has been downsized while power consumption of an electronic device has been reduced. Etching process on a quartz plate is becoming mainstream using photolithography so as to fabricate a downsized crystal unit. The quartz plate itself is formed of silicon dioxide, thus being processed with an etching technique that is generally used in a fabrication process of semiconductor devices. However, a quartz crystal, which is made of single-crystal silicon dioxide, has crystal anisotropy. For example, in the case where wet etching with hydrogen fluoride is performed to process the quartz crystal, the etching does not transfer a mask shape as it is and the etching progresses depending on a crystal orientation. This makes control of the shape extremely difficult.

Therefore, contour routing of a quartz plate by the method of dry etching is attracting attention, and the method of dry etching is hard to be affected by the crystal anisotropy. For example, Japanese Unexamined Patent Application Publication No. 8-242134 discloses a fabrication of a crystal unit by reactive ion etching using an etching gas that flows on a quartz substrate. However, an oxide single crystal such as the quartz crystal does not have good workability in a dry etching process. Thus, cracking, chipping and the like during etching easily occur. These cracking, chipping, and the like probably occur due to, for example, a temperature of the quartz plate during the dry etching reaching equal to or more than 200° C. A method is proposed to prevent cracking and chipping during dry etching. The method laminates or bonds a quartz-crystal wafer on a supporting substrate so as to support the quartz-crystal wafer and then performs dry etching on the quartz-crystal wafer in that state. In this configuration, the supporting substrate supports the whole quartz plate, thus preventing cracking and chipping of the quartz plate even in the case where temperature increases during etching. For example, Japanese Unexamined Patent Application Publication No. 2010-177540 discloses dry etching on a quartz-crystal wafer that is laminated on a supporting substrate, which is formed of silicon, glass or the like, via an adhesive film.

A crystal unit has been downsized, and MEMS (Microelectromechanical systems) technology has been developed by applying a semiconductor device fabrication technique. Accordingly, a supporting substrate itself, which is used to support the quartz-crystal wafer during dry etching, is used as a structural member (for example, a container) of the crystal unit and is being studied. However, laminating and bonding the crystal unit on the supporting substrate may result in a vibrating region bonded to the supporting substrate or a vibrating region in contact with the supporting substrate, thus impeding the quartz plate from vibrating at a resonant frequency. This results in marked deterioration of characteristics of the crystal unit.

Although Japanese Unexamined Patent Application Publication No. 2010-56833 is not related to dry etching of a quartz plate, this publication discloses a configuration to downsize a surface acoustic wave (SAW) device that includes a piezoelectric substrate formed of quartz crystal or the like. The configuration forms a resin layer on a surface of the piezoelectric substrate, and also includes a void in the resin layer which is in a forming portion of an interdigital transducer (IDT) on the piezoelectric substrate. Thus, the forming portion of the interdigital transducer is not in contact with the resin layer.

Laminating and bonding the quartz plate on the supporting substrate is an effective method for preventing cracking and chipping during processing the quartz plate by dry etching. However, using the supporting substrate bonded to the quartz plate directly as a structural portion of the crystal unit causes the vibrator in contact with the supporting substrate or the vibrator bonded to the supporting substrate. Thus, a problem arises in that marked deterioration of characteristics of the crystal unit occurs.

A need thus exists for a crystal unit and a method for fabricating the crystal unit which is susceptible to the drawback mentioned above.

SUMMARY

According to an aspect of this disclosure, a method for fabricating a crystal unit includes preparing, bonding, and separating. The preparing prepares a quartz plate and a supporting substrate with a recess that is larger than the vibrating region on a surface of the supporting substrate. The recess corresponds to a vibrating region in the crystal unit. The bonding bonds the quartz plate to the surface of the supporting substrate such that the quartz plate is separated from the supporting substrate in the recess. The separating separates the quartz plate into the vibrating region and the framing portion by performing dry etching on the quartz plate such that the quartz plate has a shape that connects the vibrating region to the framing portion via a supporting beam. The framing portion surrounds the vibrating region.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Next, preferred embodiments of this disclosure will be described by referring to the attached drawings.

A crystal unit according to this disclosure is fabricated by bonding a quartz plate and a supporting substrate together, and then processing the quartz plate by dry etching. The supporting substrate has a recess, which is larger than a vibrating region, on a surface of the supporting substrate corresponding to a vibrating region of a crystal unit.

Figure 1A:
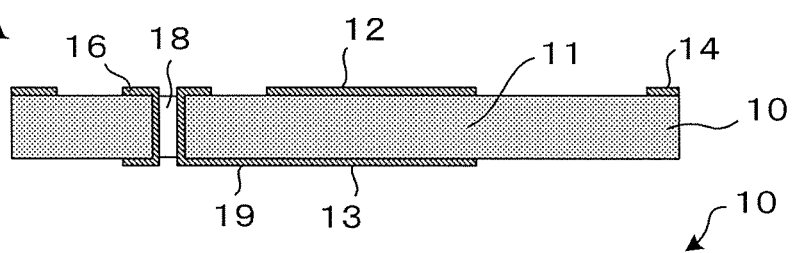
FIG. 1A is a cross-sectional view of a quartz wafer according to an embodiment of this disclosure.
Figure 1B:
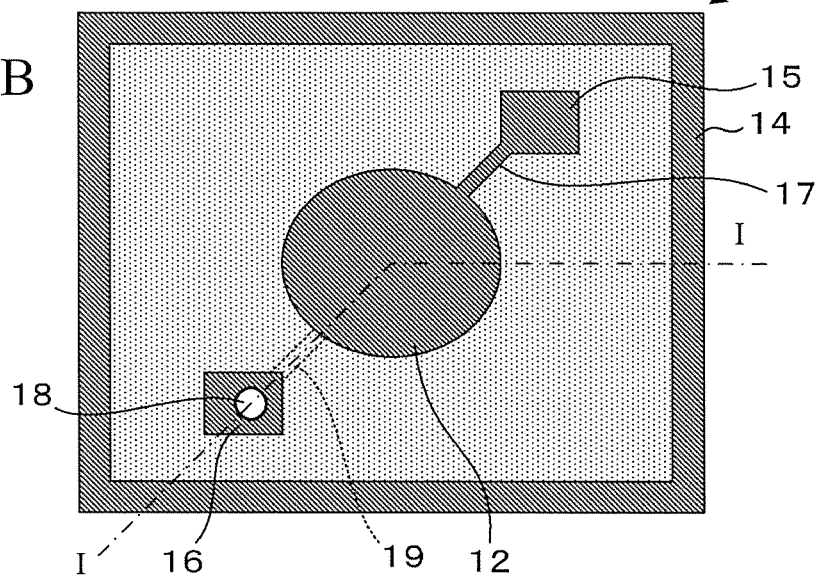
FIG. 1B is a plan view of the quartz wafer according to the embodiment of this disclosure.

FIG. 1A is a cross-sectional view of a quartz plate 10 before bonding. FIG. 1B is a plan view of the quartz plate 10 before bonding. FIG. 1A illustrates the cross-sectional surface taken along the line I-I of FIG. 1B. The quartz plate 10 is, for example, cut out from a single quartz crystal as a GT-cut quartz plate, and has approximately a rectangular shape. A plurality of crystal units may be faired at the same time using a quartz plate (that is, a quartz-crystal wafer) with a size corresponding to sizes of the plurality of crystal units, and then the quartz plate is divided into individual crystal units by dicing. In this case, a portion corresponding to one crystal unit has approximately a rectangular shape. While a case of the GT-cut quartz plate will be described as an example here, the crystal orientation is not limited to GT cut. For example, the crystal orientation may employ AT-cut or another cut.

The quartz plate 10 includes a vibrating region 11 as a center portion. The quartz plate 10 also includes excitation electrodes 12 and 13 on respective main surfaces of the quartz plate 10 corresponding to the vibrating region 11. Here, the crystal unit is assumed to be a GT-cut crystal unit using a contour vibration mode. The vibrating region 11 has an oval shape with high circularity. The excitation electrodes 12 and 13 have the same shape as the vibrating region. The quartz plate 10 includes a metal layer 14 that is fouled along an outer periphery of its main surface (a first main surface) at the upper side of the drawing. The metal layer 14 is used for bonding with a sealing member, which is described below. On the first main surface, the quartz plate 10 further includes coupling electrodes 15 and 16 in a region between the excitation electrode 12 and the metal layer 14. The coupling electrode 15 is electrically connected to the excitation electrode 12 via an extraction electrode 17 in a long thin shape. An electrically conducting path 18 is formed in a position where the coupling electrode 16 is formed and passes through the quartz plate 10 to the other main surface (a second main surface) side of the quartz plate 10. The electrically conducting path 18 is formed as a so-called through hole electrode. An extraction electrode 19 is formed on the second main surface of the quartz plate 10 and electrically connects an end portion of the electrically conducting path 18 and the excitation electrode 13. The extraction electrodes 17 and 19 are disposed in a region where supporting beams 21 and 22 are formed, as described below. The supporting beams 21 and 22 hold the vibrating region 11 at the framing portion 20, which is the outer periphery portion of the quartz plate 10. Here, the crystal unit is assumed to be a GT-cut crystal unit. The supporting beams 21 and 22 are formed to extend in mutually opposite directions from the vibrating region 11 by dry etching described below.

The excitation electrodes 12 and 13 and the extraction electrodes 17 and 19 are formed by a method such as vapor deposition or sputtering. The metal layer 14 and the coupling electrodes 15 and 16 are formed as follows. For example, a chromium (Cr) film and a gold (Au) film are formed on the quartz plate 10 in this order by sputtering, vapor deposition, or plating. Then, the metal layer 14 and the coupling electrodes 15 and 16 are patterned so as to be made of the same material with the same thickness. The excitation electrode 12, the metal layer 14, the coupling electrodes 15 and 16, and the extraction electrode 17 may be formed at the same time.

Figure 2A:
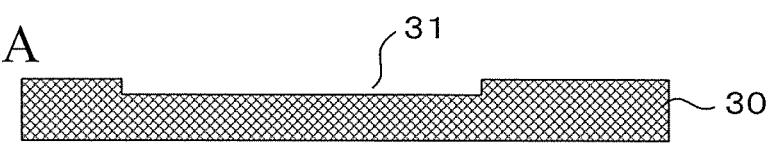
FIG. 2A is a cross-sectional view of a supporting substrate of this disclosure.
Figure 2B:
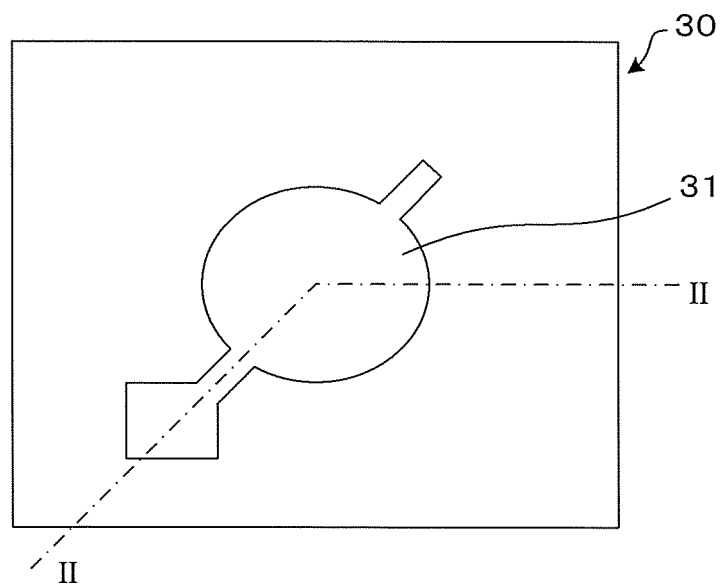
FIG. 2B is a plan view of the supporting substrate of this disclosure.

FIG. 2A is a cross-sectional view of a supporting substrate 30 before bonding. FIG. 2B is a plan view of the supporting substrate 30 before bonding. FIG. 2A illustrates a cross-sectional surface taken along the line II-II of FIG. 2B. The supporting substrate 30 is, for example, formed of silicon (Si) and the like. The supporting substrate 30 includes a recess 31 on its top surface corresponding to positions of the vibrating region 11, the supporting beams 21 and 22, and the coupling electrode 16 in the quartz plate 10. The recess 31 has a shape slightly larger than a shape including the vibrating region 11, the supporting beams 21 and 22, and the coupling electrode 16. The recess 31 is formed such that the supporting substrate 30 is processed by wet etching or dry etching, and has a depth of, for example, about 1 μm.

Figure 3:
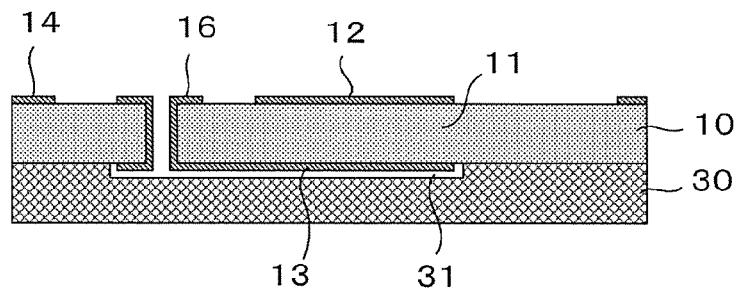
FIG. 3 is a cross-sectional view illustrating a manufacturing process of a crystal unit of this disclosure.

Next, the second main surface of the quartz plate 10 is bonded to the top surface of the supporting substrate 30. The bonding is assumed to be direct bonding, which does not use any adhesive and the like. For example, the supporting substrate 30 and the quartz plate 10 are bonded together by surface activated bonding. The surface activated bonding radiates Ar+ ion in a vacuum so as to activate surfaces. Then, the activated surfaces are bonded together by pressure bonding. This eliminate the need for heating or the like, which is an advantageous effect. FIG. 3 illustrates a cross-sectional shape after the bonding corresponding to the cross-sectional surface taken along the line I-I of FIG. 1B and the cross-sectional surface taken along the line II-II of FIG. 2B. The excitation electrode 13 and the extraction electrode 19, which are formed on the second main surface of the quartz plate 10, are arranged in the recess 31 of the supporting substrate 30. Thus, the excitation electrode 13 and the extraction electrode 19 are not directly in contact with the supporting substrate 30. Portions to be the vibrating region 11 of the quartz plate 10 and the supporting beams 21 and 22 are also not in contact with the supporting substrate 30.

Figure 4A:
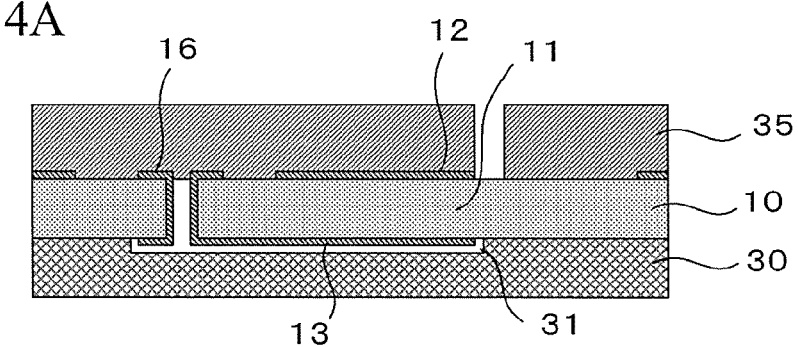
FIG. 4A is a cross-sectional view illustrating the manufacturing process of the crystal unit of this disclosure.
Figure 4B:
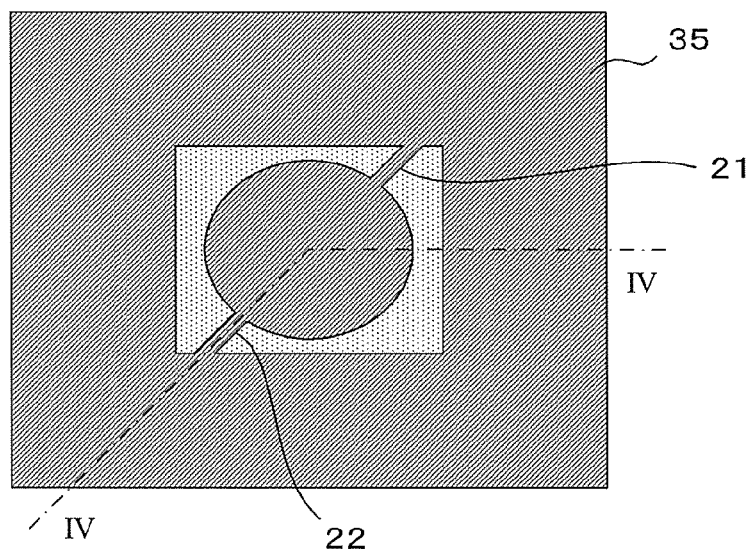
FIG. 4B is a plan view illustrating the manufacturing process of the crystal unit of this disclosure.

Next, a passivation film 35 such as resist, which is to be a mask in dry etching, is formed on the first main surface of the quartz plate 10. FIG. 4A and FIG. 4B illustrate the quartz plate 10 and the supporting substrate 30 with the passivation film 35. FIG. 4A is a cross-sectional view while FIG. 4B is a plan view. FIG. 4A illustrates a cross-sectional surface taken along the line IV-IV of FIG. 4B. The passivation film 35 is patterned by a technique such as photolithography. While the passivation film 35 is &limed on the vibrating region 11 of the quartz plate 10, the framing portion 20, and the supporting beams 21 and 22, the passivation film 35 is not formed in a region that separates the vibrating region 11 from the framing portion 20. Here, a portion of the passivation film 35 corresponding to the vibrating region 11 is formed only in a region inside the recess 31 of the supporting substrate 30, which is important.

Figure 5A:
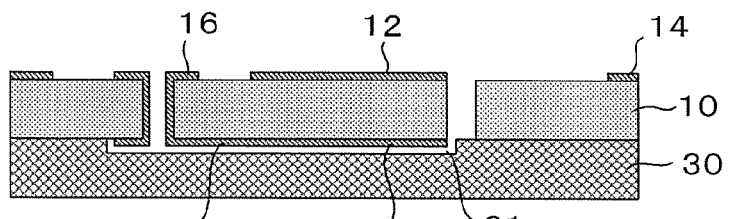
FIG. 5A is a cross-sectional view of the crystal unit of this disclosure.
Figure 5B:
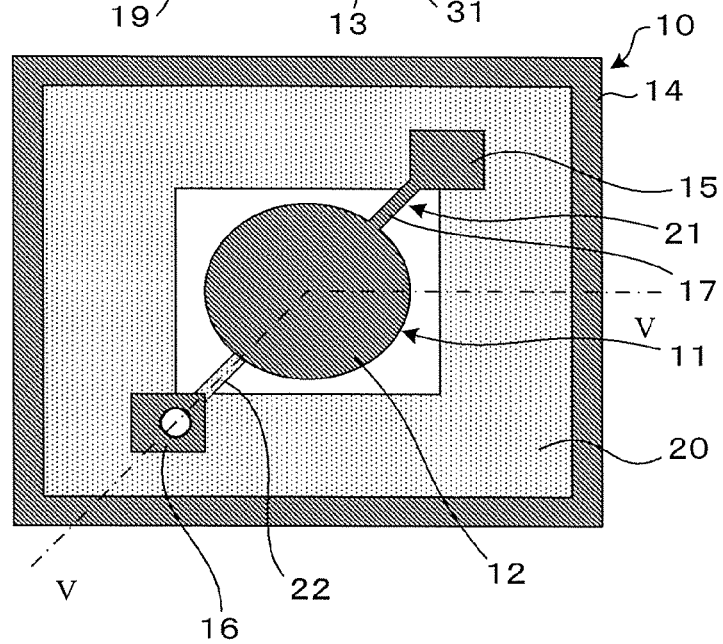
FIG. 5B is a plan view of the crystal unit of this disclosure.

Next, etching is performed using the passivation film 35 as a mask until the etching makes a hole through the quartz plate 10 and then the passivation film 35 is removed. FIG. 5A is a cross-sectional view after etching. FIG. 5B is a plan view after etching. FIG. 5A illustrates a cross-sectional surface taken along the line V-V of FIG. 5B. This embodiment has a feature that performs dry etching with the vibrating region 11 of the quartz plate 10 separating from the supporting substrate 30. An etching gas of the dry etching may employ, for example, a fluorocarbon (CF)-based gas, which is generally used for dry etching of silicon dioxide.

Figure 6:
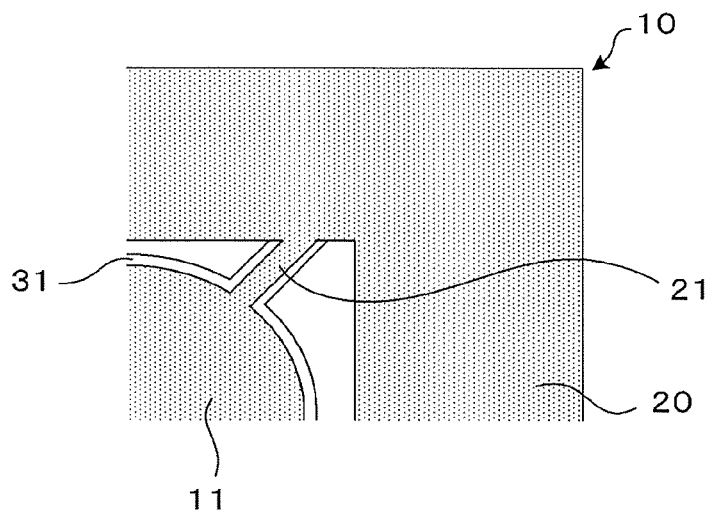
FIG. 6 is an enlarged view of a supporting portion in a vibrating region of this disclosure.

With the above processes, the quartz plate 10 is separated into the vibrating region 11 and the framing portion 20, which surrounds the vibrating region 11. The quartz plate 10 is processed such that the vibrating region 11 and the framing portion 20 have shapes that are mutually connected via the supporting beams 21 and 22. The vibrating region 11 and the supporting beams 21 and 22 are arranged in the region of the recess 31 on the supporting substrate 30. The vibrating region 11 and the supporting beams 21 and 22 are not in contact with the supporting substrate 30. Vibration of the vibrating region 11 is not impeded by the supporting substrate 30. FIG. 6 is an enlarged view of a portion that supports the vibrating region 11 in the quartz plate 10. For ease of explanation, respective electrodes are omitted in the drawing. FIG. 6 illustrates that the vibrating region 11 is arranged in the recess 31 so as not to be in contact with the supporting substrate 30.

The coupling electrodes 15 and 16 are electrically connected with the respective excitation electrodes 12 and 13. The quartz plate 10, which is being supported by the supporting substrate 30, is housed, for example, inside a ceramic package. The coupling electrodes 15 and 16 are each extracted to outside in an electrically conductive state. This consequently completes fabrication of the crystal unit.

In the case where the crystal unit is formed such that the quartz plate 10, which is being supported by the supporting substrate 30 as illustrated in FIG. 5A and FIG. 5B, is housed inside the container, a problem arises in that it is difficult to reduce a dimension in the height direction of the crystal unit. Therefore, use of the supporting substrate 30 itself may be employed as the container of the crystal unit. In this case, the following configuration is preferred. The sealing member is bonded to the first main surface of the quartz plate 10. The vibrating region 11 is hermetically enclosed in a space that is formed of the supporting substrate 30, the framing portion 20 of the quartz plate 10, and the sealing member.

Figure 7A:
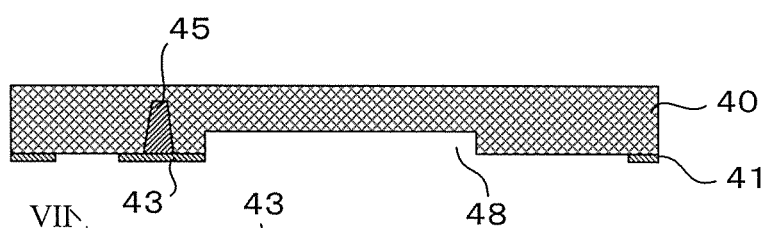
FIG. 7A is a cross-sectional view of a sealing member of this disclosure.
Figure 7B:
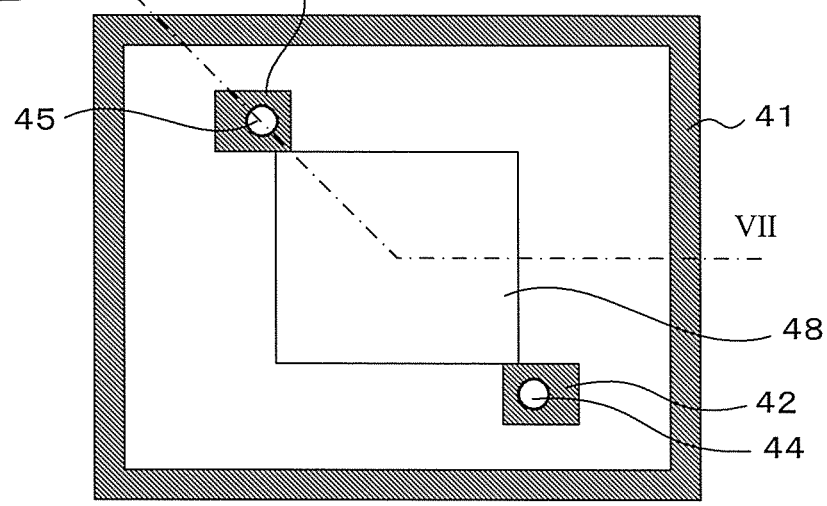
FIG. 7B is a bottom view of the sealing member of this disclosure.

FIG. 7A is a cross-sectional view of an exemplary sealing member. FIG. 7B is a bottom view of the exemplary sealing member. FIG. 7A illustrates a cross-sectional surface taken along the line VII-VII of FIG. 7B. A sealing member 40 is made of, for example, silicon. The sealing member 40 includes, on its bottom face, a metal layer 41 corresponding to the metal layer 14 of the quartz plate 10. The sealing member 40 also includes coupling electrodes 42 and 43 in positions corresponding to the coupling electrodes 15 and 16 of the quartz plate 10. The coupling electrodes 42 and 43 are made of the same material with the same thickness and by the same process as those of the metal layer 41. The sealing member 40 includes through electrodes 44 and 45 that are implanted in positions of the respective coupling electrodes 42 and 43 for external connection. The through electrodes 44 and 45 have one ends electrically connected to the respective coupling electrodes 42 and 43. The through electrodes 44 and 45 are formed such that copper (Cu) and gold are implanted by plating. Alternatively, the through electrodes 44 and 45 may be formed such that a tungsten (W) layer or a polysilicon layer doped with impurities are formed by a CVD (chemical vapor deposition) method. The sealing member 40 further includes, on its bottom face, a recess 48, which is larger than the vibrating region 11, corresponding to the vibrating region 11 of the quartz plate 10. Thus, the vibrating region 11 is not brought in contact with the sealing member 40 when the sealing member 40 is bonded to the quartz plate 10.

Figure 8A:
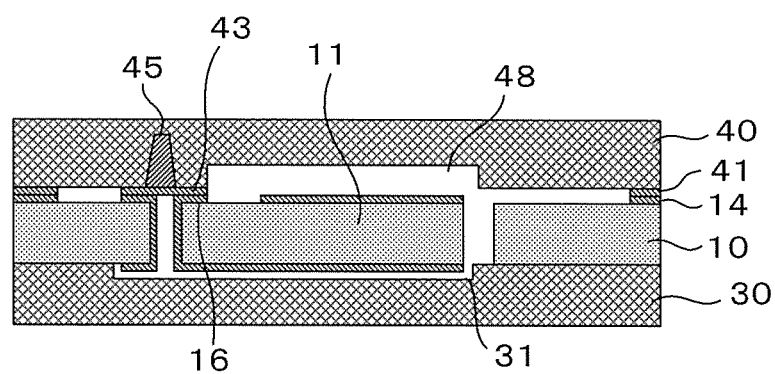
FIG. 8A is a cross-sectional view illustrating the manufacturing process of the crystal unit of this disclosure.
Figure 8B:
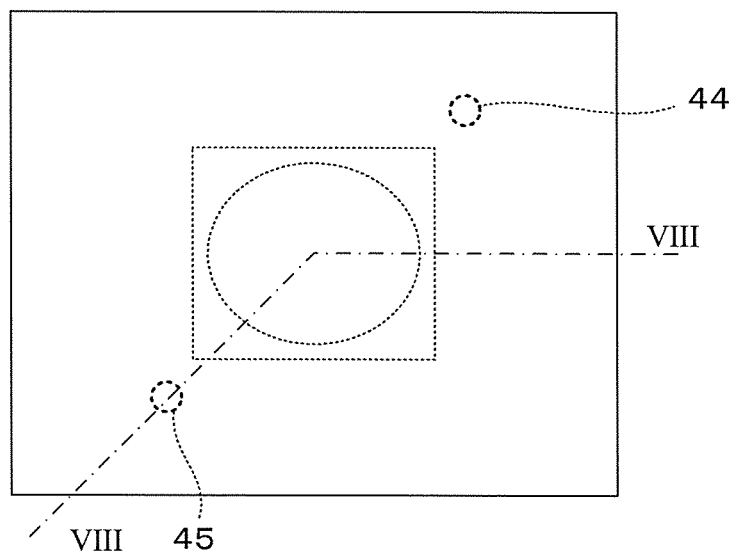
FIG. 8B is a plan view illustrating the manufacturing process of the crystal unit of this disclosure.

FIG. 8A is a cross-sectional view of the sealing member 40 bonded to the quartz plate 10. FIG. 8B is a plan view of the sealing member 40 bonded to the quartz plate 10. FIG. 8A illustrates a cross-sectional surface taken along the line VIII-VIII of FIG. 8B. The sealing member 40 is bonded to the quartz plate 10 as follows. The metal layer 14 of the quartz plate 10 and the metal layer 41 of the sealing member 40 are bonded together. Then, the coupling electrodes 15 and 16 of the quartz plate 10 are bonded to the coupling electrodes 42 and 43 of the sealing member 40. The bonding employs, for example, a method such as surface activated bonding. The bonding results in a hermetical enclosure of the vibrating region 11 of the quartz plate 10 inside the space, which is formed of the supporting substrate 30, the framing portion 20, and the sealing member 40. Especially, bonding the sealing member 40 to the quartz plate 10 in a vacuum hermetically encloses the vibrating region 11 in a vacuum.

Figure 9A:
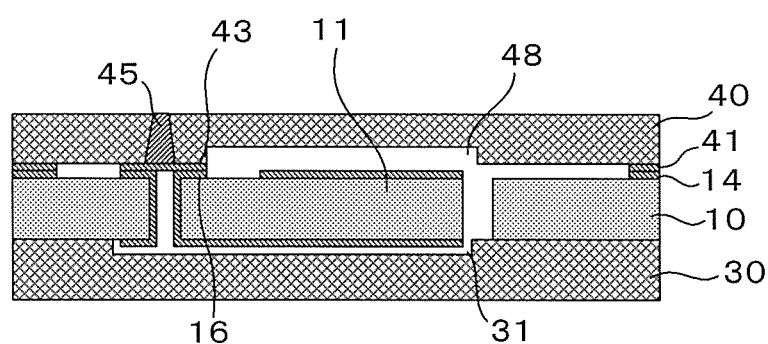
FIG. 9A is a cross-sectional view illustrating the manufacturing process of the crystal unit of this disclosure.
Figure 9B:
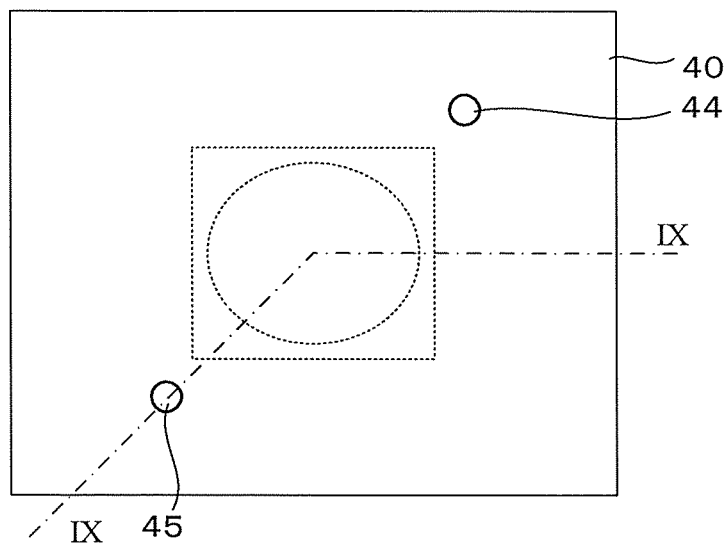
FIG. 9B is a plan view illustrating the manufacturing process of the crystal unit of this disclosure.
Figure 10A:
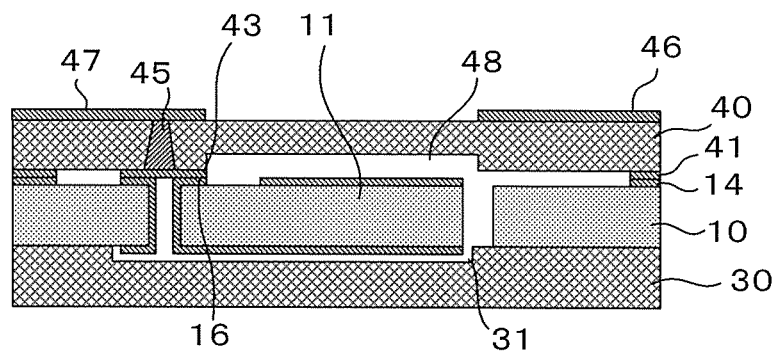
FIG. 10A is a cross-sectional view of the crystal unit of this disclosure.
Figure 10B:
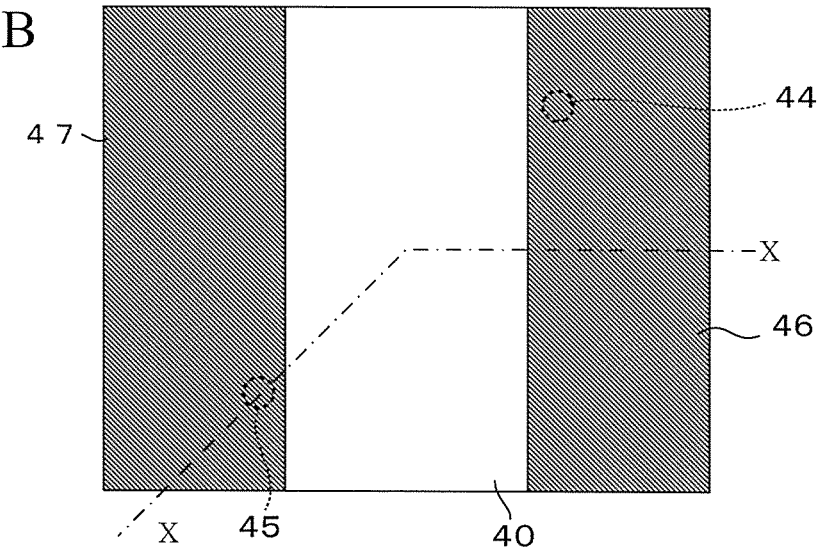
FIG. 10B is a plan view of the crystal unit of this disclosure.

Next, the through electrodes 44 and 45 are exposed by polishing (by back grinding) the sealing member 40 from the top surface side of the sealing member 40. FIG. 9A is a cross-sectional view illustrating exposed through electrodes. FIG. 9B is a plan view illustrating the exposed through electrodes. FIG. 9A illustrates a cross-sectional surface taken along the line IX-IX of FIG. 9B. After that, mounting terminals 46 and 47 are formed on the top surface of the sealing member 40 corresponding to the exposed positions of the through electrodes 44 and 45. The mounting terminals 46 and 47 are electrically connected to the through electrodes 44 and 45, thus being electrically connected to the excitation electrodes 12 and 13. The mounting terminals 46 and 47 are used for mounting the completed crystal unit on a surface of a circuit board. In the case where the quartz plate 10, the supporting substrate 30, and the sealing member 40, which each have the size corresponding to a plurality of crystal units, are used for forming the plurality of crystal units at one time, the quartz plate 10 is divided into individual crystal units by dicing in this phase. FIG. 10A is a cross-sectional view of the completed crystal unit. FIG. 10B is a plan view of the completed crystal unit. FIG. 10A illustrates a cross-sectional surface taken along the line X-X of FIG. 10B.

In this configuration, the through electrodes 44 and 45 may be formed on the sealing member 40 before bonded to the quartz plate 10. This increases degrees of freedom for materials of the through electrodes 44 and 45. Bonding the sealing member 40 to the quartz plate 10 allows sealing and electrical wiring at the same time, which is also an advantageous effect of this method.

In the crystal unit described above, the quartz plate 10 is processed by dry etching so as to separate the vibrating region 11 from the framing portion 20. In the case where the quartz crystal, which is silicon dioxide, is etched by dry etching, using a fluorocarbon based gas as the etching gas obtains high etching rate. However, a deposited material as a by-product formed by an etching reaction adheres to a side face of the etched quartz crystal. This deposited material strongly adheres to the side face of the quartz crystal. Additionally, the deposited material includes oxide as a component. Thus, it is difficult to remove the deposited material in the case where a solvent such as acetone, which is usually used in an organic removal process in the field of semiconductor device production, is employed. Even using a dedicated remover has difficulty in removal of the deposited material, which has adhered to the side face of the quartz plate.

A study by inventors has revealed that while the deposited material as a by-product formed by dry etching easily adheres to a portion at an inner side of a orthogonally folded portion and the like, the deposited material adhered to a portion on an inner surface of an arc-like shape is easily removed. That is, a portion to be processed by dry etching is formed not in a rectangular shape, but in a smooth arc-like shape. This facilitates removal of the deposited material after dry etching. In this embodiment, the crystal unit has a structure that holds the vibrating region 11 using the supporting beams 21 and 22 that extend from the framing portion 20. The vibrating region 11 has different resonant frequency and vibration characteristic depending on its shape and size. Thus, changing the shape and the size of the vibrating region 11 is not preferred in order to obtain a satisfactory vibration characteristic and a desired resonant frequency. However, a shape of an inner wall of the framing portion 20 does not affect the resonant frequency and the vibration characteristic, thus being decided freely. Accordingly, it is preferred that the framing portion 20 have an inner periphery in a shape of a circle or an ellipse in the case where the quartz plate 10 is processed by dry etching so as to separate the vibrating region 11 from the framing portion 20. It is preferred that the framing portion 20 be processed to have a polygonal shape with rounded corners in the case where the inner periphery of the framing portion 20 has difficulty in having a shape of a circle or an ellipse due to the size of the crystal unit. The polygonal shape with rounded corners is, for example, a rectangular shape with rounded corners. The rounded corners each have a curvature radius equal to or more than 0.1 µm and equal to or less than 1 mm.

Figure 11:
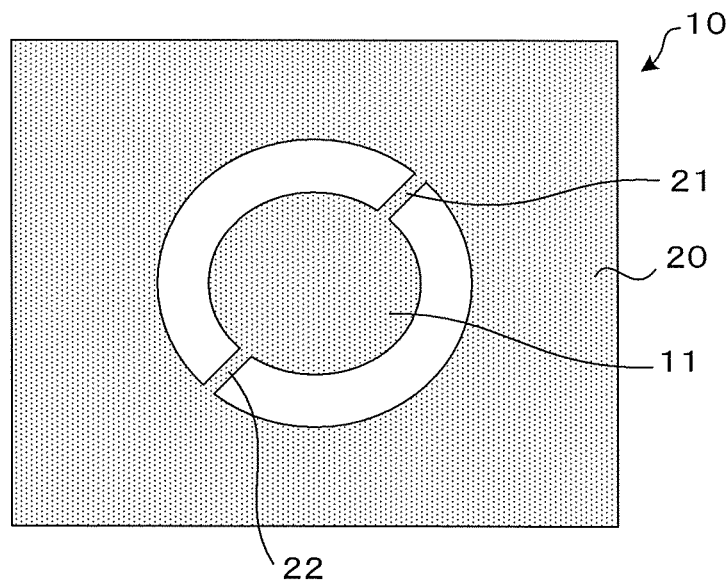
FIG. 11 is an exemplary shape of a quartz plate of this disclosure.
Figure 12:
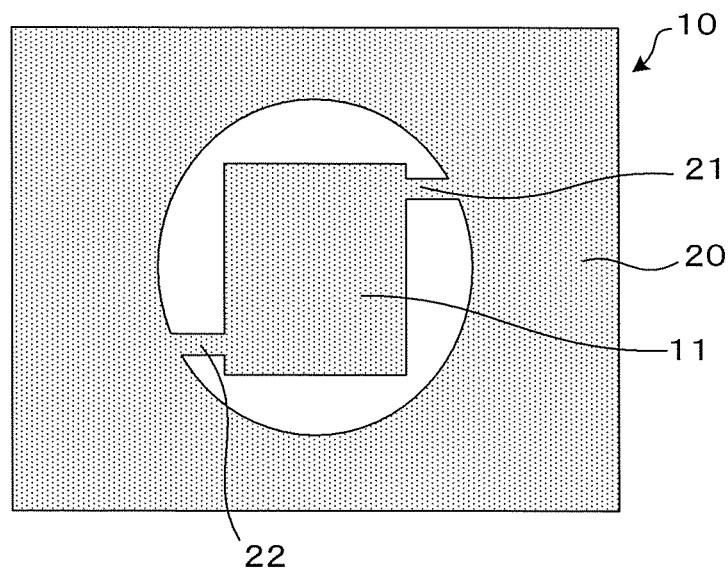
FIG. 12 is an exemplary shape of another quartz plate of this disclosure.

FIG. 11 illustrates an exemplary inner periphery, which is formed in a shape of a circle or an ellipse, of the framing portion 20. A crystal unit in FIG. 11 is assumed to be a GT-cut crystal unit and includes a vibrating region 11 that is formed in a shape of an ellipse with high circularity. FIG. 12 illustrates another example of an inner periphery, which is formed in a shape of a circle or an ellipse, of the framing portion 20. A crystal unit in FIG. 12 is assumed to be an AT-cut crystal unit and includes a vibrating region 11 that is formed in a rectangular shape.

The disclosed fabrication method preliminarily forms the recess on the surface of the supporting substrate before bonding to the quartz plate. This consequently allows dry etching to proceed in the state where the vibrating region of the quartz plate is not in contact with the supporting substrate. The crystal unit thus obtained does not make the vibrating region contacted or bonded to the supporting substrate as a crystal unit. This avoids interference with vibration of the vibrating unit. Forming the recess on the supporting substrate is performed by a method such as dry etching or wet etching. The recess employs any depth insofar as the depth surely prevents the vibrating region from contacting the supporting substrate. For example, the depth is set to equal to or more than 0.1 µm. The recess does not pass through the supporting substrate. Thus, the depth of the recess has a thickness smaller than that of the supporting substrate.

A crystal unit disclosed here includes a supporting substrate and a quartz plate bonded on a surface of the supporting substrate. The quartz plate has a shape connecting a vibrating region to a framing portion, which surrounds the vibrating region, via a supporting beam. The vibrating region is separated from the framing portion by dry etching. The surface of the supporting substrate includes a recess, which is larger than the vibrating region, corresponding to the vibrating region, so as to prevent the vibrating region from contacting the supporting substrate.

The recess, which is larger than the vibrating region, is preliminarily disposed on the supporting substrate, which supports the quartz plate during dry etching, corresponding to the vibrating region of the quartz plate. As a result, bonding the quartz plate to the supporting substrate prevents interference with the vibration of the quartz plate, thus allowing to obtain the crystal unit that maintains a good vibration characteristic.

The principles, preferred embodiment and made of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A method for fabricating a crystal unit, comprising:
preparing a quartz plate and a supporting substrate with a recess on a surface of the supporting substrate, the recess corresponding to a vibrating region in the crystal unit, the recess being larger than the vibrating region;
bonding the quartz plate to the surface of the supporting substrate such that the quartz plate is separated from the supporting substrate in the recess;
separating the quartz plate into the vibrating region and a framing portion by performing dry etching on the quartz plate such that the quartz plate has a shape, the shape connecting the vibrating region to the framing portion via a supporting beam, the framing portion surrounding the vibrating region.

2. The method according to claim 1, wherein,
on a first main surface of the quartz plate, the crystal unit further comprises:
a first excitation electrode, corresponding to the vibrating region;
first and second coupling electrodes, in a region of the framing portion; and a first extraction electrode, corresponding to the supporting beam, the first extraction electrode electrically connecting the first excitation electrode to the first coupling electrode, wherein,
an electrically conducting path is in a position of the second coupling electrode, the electrically conducting path passing through the quartz plate, and;
on a second main surface of the quartz plate, the crystal unit further comprises:
    a second excitation electrode, corresponding to the vibrating region; and
    a second extraction electrode, corresponding to the supporting beam, the second extraction electrode electrically connecting the second excitation electrode to the electrically conducting path, wherein,
the second main surface of the quartz plate is bonded to the supporting substrate.

3. The method according to claim 2, further comprising:
bonding a sealing member to the framing portion, the sealing member including:
    a first through electrode, corresponding to the first coupling electrode; and
    a second through electrode, corresponding to the second coupling electrode, wherein,
the vibrating region is hermetically enclosed inside a space, the space being formed of the supporting substrate, the framing portion, and the sealing member.

4. The method according to claim 1, wherein,
the framing portion includes an inner periphery,
the inner periphery is processed to be one of shapes of a circle, an ellipse, and a polygon having rounded corners by the dry etching in the separating step.

5. The method according to claim 2, wherein,
the framing portion includes an inner periphery,
the inner periphery is processed to be one of shapes of a circle, an ellipse, and a polygon having rounded corners by the dry etching in the separating step.

6. The method according to claim 3, wherein,
the framing portion includes an inner periphery,
the inner periphery is processed to be one of shapes of a circle, an ellipse, and a polygon having rounded corners by the dry etching in the separating step.

7. The method according to claim 1, wherein,
the supporting substrate includes a silicon substrate, and
the quartz plate is bonded to the supporting substrate by a surface activated bonding.

8. The method according to claim 1, wherein,
the vibrating region is formed as a vibrating region which is one of GT-cut and AT-cut vibrating regions.

9. A crystal unit manufactured by the method according to claim 1, the crystal unit comprising:
a supporting substrate; and
a quartz plate bonded on a surface of the supporting substrate, wherein
the quartz plate has a shape, the shape connecting a vibrating region to a framing portion via a supporting beam, the supporting beam surrounding the vibrating region, wherein
the vibrating region is separated from the framing portion by a dry etching, and
the surface of the supporting substrate includes a recess corresponding to the vibrating region, the recess being larger than the vibrating region so as to prevent the vibrating region from contacting the supporting substrate.

10. The crystal unit according to claim 9, wherein,
on a first main surface of the quartz plate, the crystal unit further comprises:
    a first excitation electrode, corresponding to the vibrating region;
    first and second coupling electrodes, in a region of the framing portion; and
    a first extraction electrode, corresponding to the supporting beam, the first extraction electrode electrically connecting the first excitation electrode to the first coupling electrode, wherein,
an electrically conducting path is in a position of the second coupling electrode, the electrically conducting path passing through the quartz plate, and
on a second main surface of the quartz plate, the crystal unit further comprises:
    a second excitation electrode, corresponding to the vibrating region; and
    a second extraction electrode, corresponding to the supporting beam, the second extraction electrode electrically connecting the second excitation electrode to the electrically conducting path, wherein,
the second main surface of the quartz plate is bonded to the supporting substrate.

11. The crystal unit according to claim 10 further comprising:
a sealing member bonded to the framing portion, the sealing member including:
    a first through electrode, corresponding to the first coupling electrode; and
    a second through electrode, corresponding to the second coupling electrode, wherein,
the vibrating region is hermetically enclosed inside a space, the space being formed of the supporting substrate, the framing portion, and the sealing member.

12. The crystal unit according to claim 9, wherein,
the framing portion includes an inner periphery,
the inner periphery is processed to be one of shapes of a circle, an ellipse, and a polygon having rounded corners by the dry etching.

13. The crystal unit according to claim 10, wherein,
the framing portion includes an inner periphery,
the inner periphery is processed to be one of shapes of a circle, an ellipse, and a polygon having rounded corners by the dry etching.

14. The crystal unit according to claim 11, wherein,
the framing portion includes an inner periphery,
the inner periphery is processed to be one of shapes of a circle, an ellipse, and a polygon having rounded corners by the dry etching.

15. The crystal unit according to claim 9, wherein,
the supporting substrate includes a silicon substrate, and
the quartz plate is bonded to the supporting substrate by a surface activated bonding.

16. The crystal unit according to claim 9, wherein,
the vibrating region is formed as a vibrating region which is one of GT-cut and AT-cut vibrating regions.

* * * * *